United States Patent
Yang et al.

(10) Patent No.: US 7,071,847 B2
(45) Date of Patent: Jul. 4, 2006

(54) ENCODING METHOD OF RECORDING MEDIA

(75) Inventors: Yung-Chi Yang, Hsinchu (TW); Pi-Hai Liu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/933,650

(22) Filed: Sep. 3, 2004

(65) Prior Publication Data

US 2005/0140526 A1    Jun. 30, 2005

(30) Foreign Application Priority Data

Dec. 26, 2003    (TW) .............................. 92137221 A

(51) Int. Cl.
*H03M 7/00* (2006.01)
(52) U.S. Cl. ............................. 341/50; 341/59; 341/69; 341/41; 341/68
(58) Field of Classification Search ................. 341/50, 341/59, 68, 41; 714/792; 704/201; 369/59.24
See application file for complete search history.

(56) References Cited

U.S. PATENT DOCUMENTS

| | | | | |
|---|---|---|---|---|
| 5,508,701 A | * | 4/1996 | Nose et al. .................... | 341/58 |
| 5,622,632 A | * | 4/1997 | Gallup ........................ | 210/669 |
| 5,682,153 A | * | 10/1997 | Ishiguro ....................... | 341/53 |
| 5,748,119 A | * | 5/1998 | Ko .............................. | 341/59 |
| 6,023,234 A | * | 2/2000 | Fukuoka ....................... | 341/58 |
| 6,084,536 A | * | 7/2000 | Arts ............................ | 341/58 |
| 6,347,390 B1 | * | 2/2002 | Ino ............................. | 714/792 |
| 6,362,757 B1 | * | 3/2002 | Lee et al. .................... | 341/102 |
| 6,647,366 B1 | * | 11/2003 | Wang et al. ................. | 704/201 |
| 6,670,896 B1 | * | 12/2003 | Hayami ....................... | 341/59 |
| 6,690,308 B1 | * | 2/2004 | Hayami ....................... | 341/68 |
| 6,737,996 B1 | * | 5/2004 | Kurokawa et al. ............ | 341/68 |
| 6,807,137 B1 | * | 10/2004 | Chuang ..................... | 369/59.24 |
| 2003/0227398 A1 | * | 10/2002 | Chen et al. | |

\* cited by examiner

*Primary Examiner*—Jean Bruner Jeanglaude
(74) *Attorney, Agent, or Firm*—Welsh & Katz, Ltd.

(57) ABSTRACT

An encoding method of recording media is used to speed up the encoding procedure in a recording media. Different conditions of states and paths set in advance during the encoding procedure to simply the actual operation loading for possible paths in the look-ahead calculation, thereby achieving fast encoding. Using the method, the operation of the look-ahead calculation of an exponential growth is greatly reduced to a linear growth.

10 Claims, 4 Drawing Sheets

ENCODING METHOD OF RECORDING MEDIA

BACKGROUND OF THE INVENTION

1. Field of Invention

The invention relates to a data encoding method and, in particular, to an encoding in a recording media that simplifies the actual operation loading in the look-ahead calculation, thereby speeding up the encoding procedure.

2. Related Art

The encoding mechanism for recording media is mainly used to encode data words using specific encoding procedures into code words so as to be stored in an ordered way within a small storage space on a recording media. One can use a set of specific decoding rules to restore the original data words.

In the encoding procedure, the coding rate directly affects the data capacity that can be stored in a recording media. Therefore, an encoding method of high coding rate has been the goal of related fields. In the past, trying to increase the coding rate results in the decrease in selectable code words. And this kind of encoding method further has worse code word sequence properties, particularly in the DC component control ability. To enhance the code word sequence properties, an encoding method combines the look-ahead calculation has been created to perform encoding procedures.

The so-called look-ahead calculation is as follows. First, one computes paths for several successive data words in advance. An optimal path is searched using predetermined conditions, and then the code words of the optimal path are then used for encoding. Generally speaking, the longer the length of look-ahead is, the better properties the code word sequence will have. And the computation loading increases exponentially with the length of the look-ahead at the same time. This will inevitably results in the delay of the encoding speed.

As the encoding method with look-ahead calculation becomes more popular, it is necessary to improve its calculation algorithm. It is imperative to simplify the computation loading of possible paths in the look-ahead calculation, thereby increasing its efficiency and practicality.

SUMMARY OF THE INVENTION

In view of the foregoing, the invention provides an encoding method for recording media. It further provides an improved look-ahead calculation method.

Using different limitations set in advance during the encoding procedure, the invention simplifies the actual computation loading of possible paths in the look-ahead calculation. The limitations include the state and the path. So, an optimal possible path can be rapidly singled out from the look-ahead calculation to highly perform the encoding procedure of code word sequence. Using the disclosed method, the operation of the look-ahead calculation of an exponential growth is greatly reduced to a linear growth.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The invention provides an improved look-ahead calculation for the encoding method for recording media. By reducing the computation loading of look-ahead calculation, the efficiency of the encoding time is greatly increased.

Figure 1:
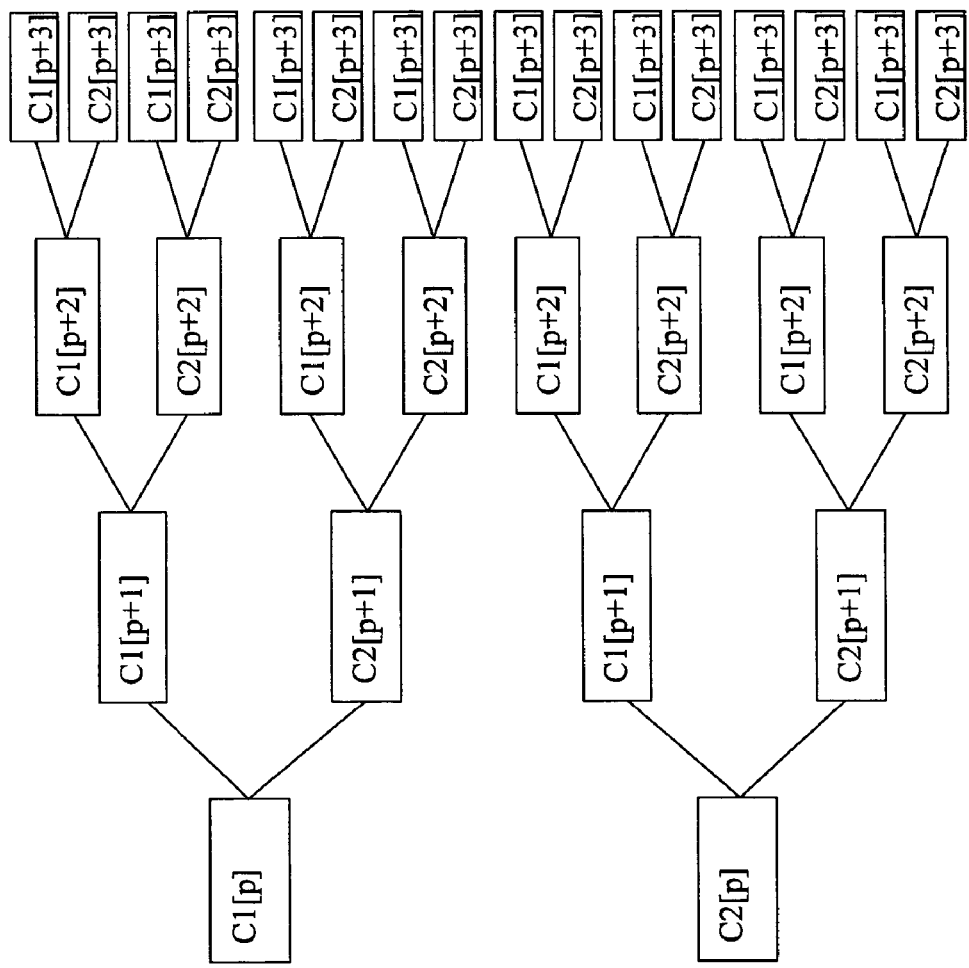
FIG. 1 is a tree diagram of the computation loading for the look-ahead calculation in the prior art.

The look-ahead calculation used in the prior art has the computation loading as shown in FIG. 1. We suppose each data word has two following candidate code words for selection. So the one-step look-ahead calculation involves four different paths, the two-step look-ahead operation involves eight different paths, etc. When performing a k-step look-ahead calculation, there will involve $2^{(k+1)}$ different paths. Thus, the computation loading grows exponentially.

Figure 2A:
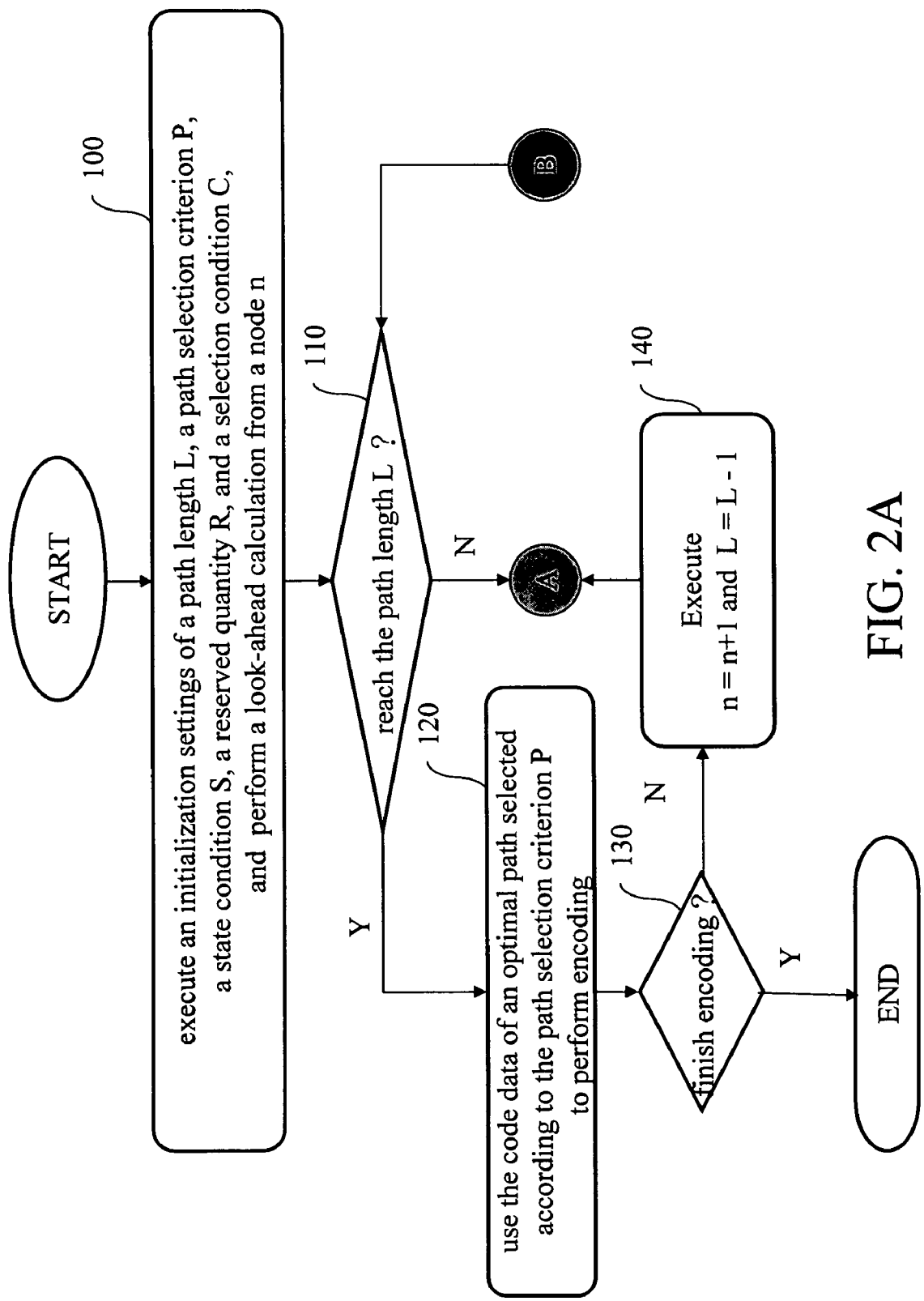
FIGS. 2A and 2B are flowcharts of the disclosed encoding method for recording media.
Figure 2B:
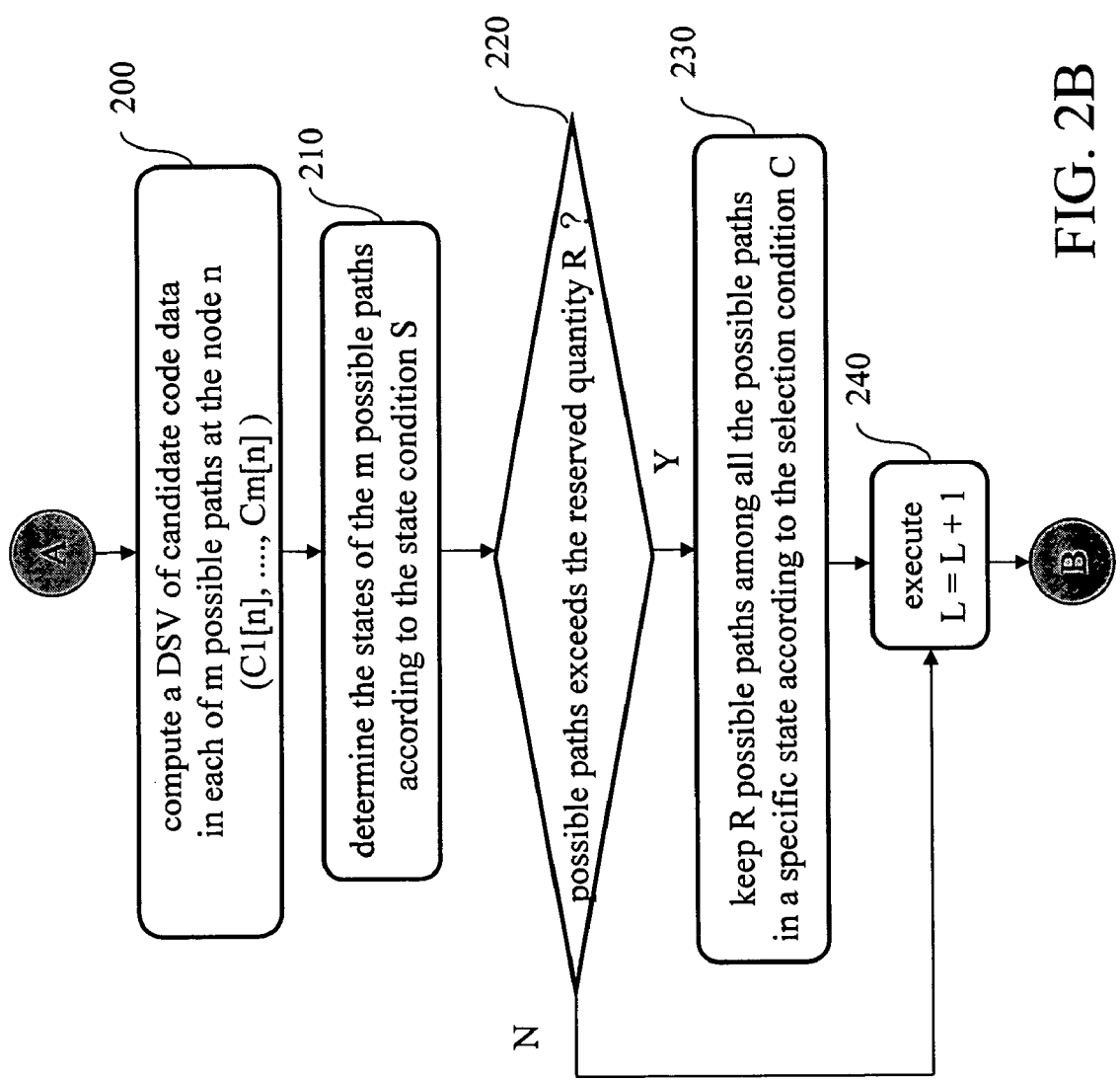

To effectively prevent the exponential growth in the computation loading of the look-ahead calculation in the prior art, the invention provides a method depicted in FIGS. 2A and 2B to simplify the look-ahead calculation to improve the efficiency of the encoding time. We explain the method in the following paragraphs.

First, one performs initialization settings and starts the look-ahead calculation from the node n (step 100), where n is any positive integer. This step further involves the following two steps:

(1) Perform the initialization settings for selecting optimal code word. This includes the path length L and the path selection criteria P.

The path length L refers to the length of look-ahead required for the look-ahead calculation. Basically, it only needs to be a positive integer. It is usually set according to the need of code word sequence properties in reality. The path selection criteria P are limitations used to select the optimal path from various possible paths. The minumum absolute of a digital sum value (DSV) is often used as the criterion for an optimal path. That is, the path with the minimum absolute DSV among all possible paths is picked as the optimal path. (However, the actual path selection criteria are not limited to this.)

(2) Perform the initialization settings for computing possible paths. This includes the state condition S, the reserved quantity R, and the selection condition C.

The state condition S is used to determine the states of each of the nodes n on each of the possible paths. The state can be classified into the following three types:

1. Use the sign of the DSV for binary state division. If the DSV is positive, it is state 1; if the DSV is negative, it is state 2.

2. Use the number of specific numerical value in the code word for binary state division. Since the numerical value 1 in the code word represents a turning point, the number of 1 directly affect the sign of the DSV. Therefore, one can use the number of 1 (even or odd) to decide the state. If there is an odd number of 1, it is state 1; if there is an even number of 1, it is state 2.

3. Combine the above two types for quaternary division. That is, one simultaneously uses the sign of DSV and the number of specific numerical value for the division. If the code word have an even number of 1 and the DSV is positive, it is state 1; if the code word have an even number of 1 and the DSV is negative, it is state 2; if the code word have an odd number of 1 and the DSV is positive, it is state 3; and if the code word have an odd number of 1 and the DSV is negative, it is state 4.

The reserved quantity R is used to assign the largest reserved quantity of possible paths in each state. Its value is generally a positive integer. It is not speficied by the invention, and can be defined according to practical needs.

The selection condition C is used when the number of possible paths in each state exceeds the reserved quantity R to rule out redundant possible paths that do not satisfy the selection condition in order to simplify the computation loading of the look-ahead calculation.

After completing the settings in step 100, the method starts to perform the look-ahead calculation. It first determines whether the current operation has reached the path length L (step 110). First, the method decides if the length of look-ahead current calculated is smaller than the path length L, it means that the look-ahead calculation for the current node n has not completed. The procedure will enters step A in FIG. 2B to continue the following steps.

First, computing the DSV $C1[n], \ldots, Cm[n]$ of each candidate code word on the m possible paths of the node n (step 200). The value of m is determined according to an encoding rule. (Usually, m is any positive integer.) Afterwards, the state condition S is employed to determine the state of each possible path at the current node n (step 210). The method then checks whether the number of possible paths in each state exceeds the reserved quantity R (step 220). When the number of possible paths in each state exceeds the reserved quantity R, the selection condition C is used to reserve possible paths satisfying the number of the reserved quantity R (step 230). When the reserved quantity R is 2, it means that each state is left with only two possible paths for subsequent calculations in each state. The method completes first look-ahead calculation.

The method then continues to step 240 for executing the next look-ahead calculation and for updating the path length L (i.e. L=L+1). The method now enters step B in FIG. 2A, returning to step 110 to repeatedly execute steps 200 to 240. On the other hand, if the number of possible paths in each state in step 220 does not exceed the number of the reserved quantity R, the procedure goes directly to step 240.

The above-mentioned selection condition C can be set as the combination of various mathematical operations on the DSV at each node n, such as the maximum or minimum of DSV, the maximum or minimum of the absolute DSV, the maximum or minimum of the sum of the absolute DSV's of all nodes, the maximum or minimum of the absolute value of the sum of DSV's of all nodes, the maximum or minimum of the average of DSV's of all nodes, and the maximum or minimum of the standard deviation of the DSV's of all nodes.

When the current length of look-ahead calculated is equal to the path length L (step 110), it means that the look-ahead calculation has completed. The method then performs the following steps.

First, the path selection criteria P are used to select the code words of the optimal path among possible paths to perform encoding (step 120). After finishing the encoding of the node n, the method determines whether all the recording media encoding has been completed (step 130). If not completed, the method continues to calculate the look-ahead path of the next node (n=n+1) and updates the path length L (L=L−1). Return to step A in FIG. 2B, and use n=n+1 and L=L−1 to repeat steps 200 to 240. If the encoding has been completed, the method ends.

Take a look-ahead calculation with a path length equal to 3 as an example. When step 140 is executed, the calculation data of node (k-3) are removed at the same time while keeping the calculation data of the node (k-1) and node (k-2). Therefore, when entering step A, the method only needs to continue the calculation of the node k. This can greatly reduce repeated calculation loading and increase the overall efficiency. For example, after completing the calculations for the node 1, the node 2, and the node 3, the calculation data of the node 1 are removed. The calculation of the node 4 is then added. This avoids repeating the calculations for the node 2 and the node 3.

Figure 3:
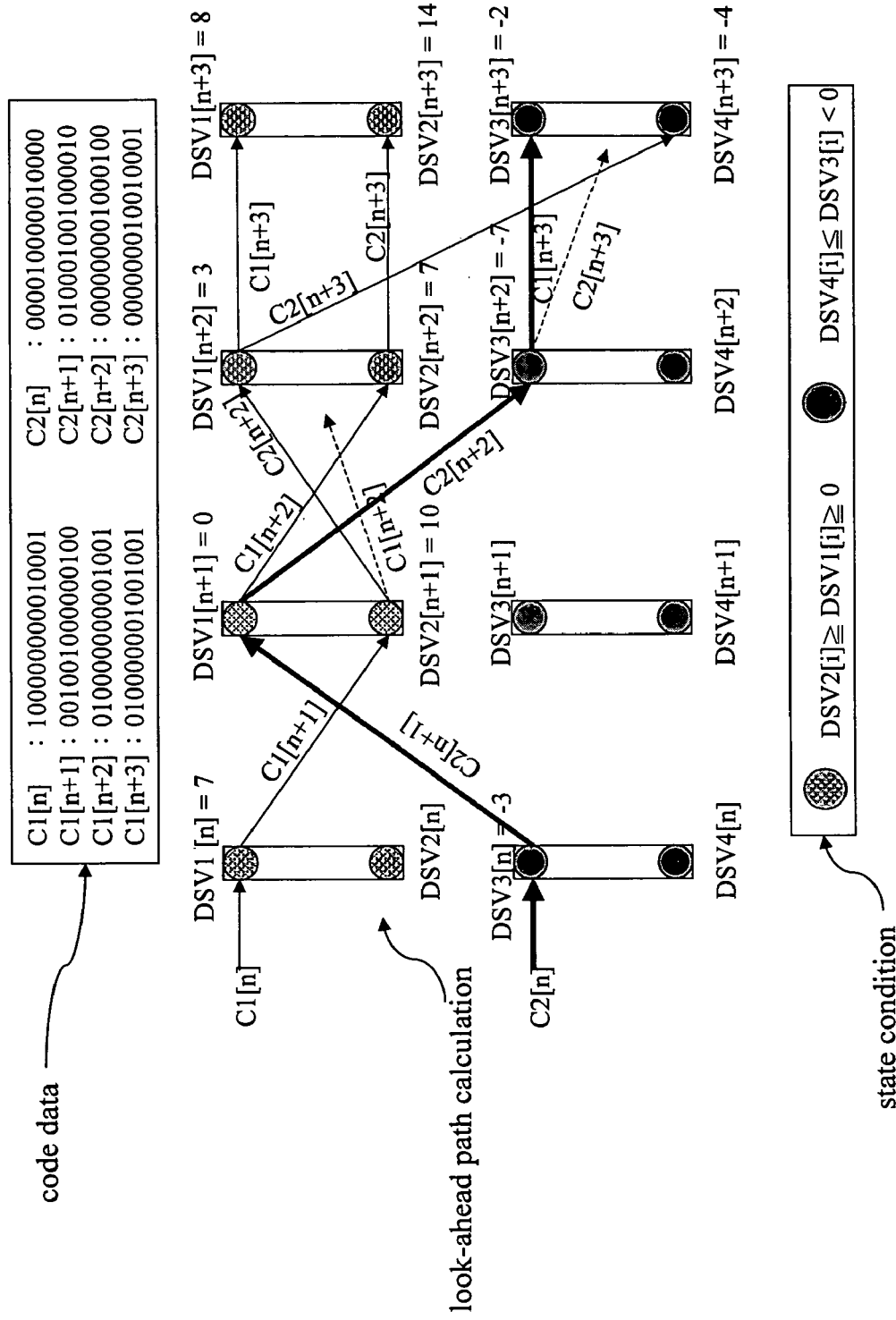
FIG. 3 is a schematic view of a preferred embodiment of the invention.

We refer to FIG. 3 as a preferred embodiment of the invention to explain the operational procedure of the disclosed method. We set the path length L=3. The path selection criterion P is the minimum absolute value of the DSV. The state condition S uses the sign of the DSV for binary state division; so the positive DSV being state 1 and the negative DSV state 2. The reserved quantity R is set as 2. The selection condition C uses the maximum or minimum of the DSV to determine whether it is kept. In state 1, two possible paths with smaller DSV's are kept. In state 2, two possible paths with larger DSV's are kept.

Each data word on node n to node (n+3) has a corresponding code word listed in the following (as shown in FIG. 3):

| | | | |
|---|---|---|---|
| C1[n]     | 100000000010001 | C2[n]     | 000010000010000 |
| C1[n + 1] | 001001000000100 | C2[n + 1] | 010001001000010 |
| C1[n + 2] | 010000000001001 | C2[n + 2] | 000000001000100 |
| C1[n + 3] | 010000001001001 | C2[n + 3] | 000000010010001 |

First, we start to perform the look-ahead calculation from the node n. On the n-th node, the DSV of C1[n] is 7, belonging to state 1; the DSV of C2[n] is −3, belonging to state 2 according to the above settings.

At the (n+1)-th node, to satisfy the constraints of the specific encoding rule, so C1[n] can only be followed by C1[n+1]. Its DSV after the connection is 10, belonging to state 1. C2[n] can only be followed by C2[n+1]. Its DSV after the connection is 0, also belonging to state 1. Since the predetermined reserved quantity R=2, two possible paths can be kept. Therefore, these paths are both kept.

At the (n+2)-th node, we know that C1[n+1] can be connected to C1[n+2] and C2[n+2]. The DSV after connecting with C1 [n+2] is 17, being state 1. The DSV after connecting with C2[n+2] is 3, also state 1. C2[n+1] can be connected to C1[n+2] and C2[n+2]. The DSV after connecting with C1 [n+2] is 7, being state 1. The DSV connecting with C2[n+2] is −7, being state 2. Therefore, there are three possible paths belonging to state 1 at the (n+2)-th node. According to the reserved quantity R, there are only two possible paths can be kept. So the method follows the predetermined selection condition C to select among state 1 the two paths with smaller DSV's. That is, the path with DSV=17 is deleted. Since there is only one possible path in state 2, below the reserved quantity R, it is therefore kept.

At the (n+3)-th node, the specific encoding rule dictates that C1[n+2] can only be followed by C2[n+3]. The DSV after the connection is 14, being state 1. C2[n+2] can connect to C1[n+3] and C2[n+3]. The DSV after connecting C2[n+2] with C1[n+3] is 8, also state 1. The DSV after connecting C2[n+2] with C2[n+3] is −4, being state 2. The DSV after connecting C2[n+2] with C1[n+3] is −2, being state 2. The DSV after connecting C2[n+2] with C2[n+3] is −14, also state 2. Therefore, there are two possible paths belonging to state 1 at the (n+3)-th node and both of them are kept. Since there are now three possible paths in state 2, the two possible paths with larger DSV's are kept according to the selection condition C. Consequently, the possible path with DSV=−14 is deleted.

Since the method has reached the predetermined path length L, it starts to find the optimal path among all the possible paths. All the possible paths kept at the (n+3)-th node are subject to the predetermined path selection criterion P to give a possible path with the smallest absolute value of the DSV. Consequently, the possible path with DSV=−2 is selected as the optimal path. The corresponding code word at the n-th node is C2[n] and it is output for the encoding.

The disclosed method can be generalized to use quaternary states and to keep more than two paths. Such modifications are still within the spirits of the invention.

Certain variations would be apparent to those skilled in the art, which variations are considered within the spirit and scope of the claimed invention.

What is claimed is:

1. An encoding method for a recording media for simplifying the calculation loading of possible paths by using predetermined state and path conditions during a look-ahead calculation of a encoding procedure and increasing an overall encoding speed, the method comprising the steps of:

executing initialization settings and performing a look-ahead calculation from a node n, which further includes the steps of:

executing initialization settings of a path length L and a path selection criterion P required for selecting optimal code word for encoding; and executing initialization settings of a state condition S, a reserved quantity R, and a selection condition C required for computing possible paths;

when the length of look-ahead is smaller than said path length L, the current step further comprising the steps of:

computing a digital sum value (DSV) of candidate code word in each of m possible paths at the node n: C1[n], . . . , Cm[n];

determining the states of said m possible paths according to the state condition S;

reserving R possible paths among m possible paths according to the selection condition C when its number exceeds the reserved quantity R; and executing the next look-ahead calculation; and when the length of look-ahead is equal to the path length L, the current step further contains the steps of:

using the code word of an optimal path selected according to the path selection criterion P to perform encoding; and executing the look-ahead calculation of the next node when the encoding is not completed.

2. The method of claim 1, wherein m and n are arbitrary non-negative integers.

3. The method of claim 1, wherein the path length L is an arbitrary positive integer.

4. The method of claim 1, wherein the path selection criterion P is the minimum of the absolute value of the DSV.

5. The method of claim 1, wherein the path selection criterion P is the same as the selection condition C.

6. The method of claim 1, wherein the state condition S uses the sign of the DSV for binary state division.

7. The method of claim 1, wherein the state condition S uses the number of a specific numerical value in the code words for binary state division.

8. The method of claim 1, wherein the state condition S uses the sign of the DSV and the number of a specific numerical value in the code word for quaternary state division.

9. The method of claim 1, wherein the reserved quantity R is an arbitrary positive integer.

10. The method of claim 1, wherein the selection condition C is a combination of mathematical operations on the DSV of each node n, and is selected from the group consisting of the maximum or minimum of DSV, the maximum or minimum of the absolute DSV, the maximum or minimum of the sum of the absolute DSV's of all nodes, the maximum or minimum of the absolute value of the sum of DSV's of all nodes, the maximum or minimum of the average of the sum of DSV's of all nodes, and the maximum or minimum of the standard deviation of the sum of DSV's of all nodes.

* * * * *